(12) United States Patent
Astrom et al.

(10) Patent No.: US 9,444,468 B2
(45) Date of Patent: Sep. 13, 2016

(54) OSCILLATOR DEVICES AND METHODS

(71) Applicant: Infineon Technologies AG, Neubiberg (DE)

(72) Inventors: David Astrom, Feffernitz (AT); Andreas Fugger, Villach (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 93 days.

(21) Appl. No.: 14/138,290

(22) Filed: Dec. 23, 2013

(65) Prior Publication Data
US 2015/0180483 A1 Jun. 25, 2015

(51) Int. Cl.
| | |
|---|---|
| H03K 3/26 | (2006.01) |
| H03L 7/06 | (2006.01) |
| H03L 7/18 | (2006.01) |
| H03L 7/02 | (2006.01) |
| H03L 7/00 | (2006.01) |
| H03K 3/0231 | (2006.01) |

(52) U.S. Cl.
CPC ............... *H03L 7/06* (2013.01); *H03K 3/0231* (2013.01); *H03L 7/00* (2013.01); *H03L 7/02* (2013.01); *H03L 7/18* (2013.01)

(58) Field of Classification Search
CPC ............ H03L 7/02; H03L 7/18; H03H 11/16
USPC .... 331/1 R, 25, 74, 177 R, 111, 143, 113 R; 327/156, 232
See application file for complete search history.

(56) References Cited

U.S. PATENT DOCUMENTS

| | | | |
|---|---|---|---|
| 5,359,301 A | 10/1994 | Candage | |
| 5,917,383 A | 6/1999 | Tso et al. | |
| 5,994,967 A | 11/1999 | Nguyen | |
| 6,094,103 A | 7/2000 | Jeong et al. | |
| 6,342,817 B1 | 1/2002 | Crofts et al. | |
| 6,614,313 B2 | 9/2003 | Crofts et al. | |
| 8,378,752 B2 | 2/2013 | Sako et al. | |
| 8,487,693 B2 | 7/2013 | Sanduleanu et al. | |
| 2014/0320216 A1* | 10/2014 | Wang | 331/25 |

OTHER PUBLICATIONS

Viswanathan, T.R., et al., "Switched-Capacitor Frequency Control Loop," IEEE Journal of Solid-State Circuits, Aug. 1982, 775-778, vol. SC-17, No. 4.

* cited by examiner

*Primary Examiner* — Arnold Kinkead
(74) *Attorney, Agent, or Firm* — Slater Matsil, LLP (57) ABSTRACT

Oscillator devices and corresponding methods are disclosed. In some embodiments an apparatus includes an oscillator circuit arrangement, a frequency variable resistor circuit coupled to an output of the oscillator circuit arrangement and a reference resistor circuit. The apparatus further includes a sample and hold circuit, wherein a first input of the sample and hold circuit is coupled to an output of the reference resistor circuit and a second input of the sample and hold circuit is coupled to an output of the frequency variable resistor circuit, wherein an output of the sample and hold circuit is coupled with an input of the oscillator circuit arrangement.

20 Claims, 5 Drawing Sheets

OSCILLATOR DEVICES AND METHODS

TECHNICAL FIELD

The present application relates to oscillator devices and to corresponding methods.

BACKGROUND

Oscillator devices are commonly used to generate periodic signals having a certain frequency. Such periodic signals may for example be used as clock signals, for example, for clocking a digital logic. In other examples, such periodic signals may be used as carrier signals for data communication.

For example, in integrated circuits (ICs), e.g., system ICs, for automotive or industrial applications integrated oscillators are used for supplying a digital logic and/or for supplying communication devices. For such communication devices, for example, a controller area network (CAN)- interfaces, it is necessary to generate a precise clock signal having a high frequency, for example, of the order of 80 MHz, although other frequencies may be required as well, e.g., in other applications. In some applications, frequency variations of a signal generated by the oscillator device have to be minimized, for example, limited to a range of ±1%, although other accuracies may also be required. On the other hand, for many applications it is desirable to keep a power consumption of the oscillator device low, to have a low start-up time of the oscillator device, and/or to minimize a chip area required for the oscillator device.

In some conventional oscillator devices, frequency dependent resistors may be used in a control loop. However, in some conventional approaches the use of a frequency dependent resistor may cause sawtooth-like signals, which requires filtering. Such filtering may in some cases require considerable chip area and/or may make achieving low start-up times difficult.

In the following, illustrative embodiments will be described with reference to the attached drawings. It is to be noted that these embodiments serve illustrative purposes only and are not to be construed as limiting the scope of the present application. For example, while embodiments may be described as comprising a plurality of elements, in other embodiments some of these elements may be omitted and/or replaced by alternative elements. In still other embodiments, additional elements may be provided. Furthermore, elements from different embodiments may be combined with each other to form additional embodiments unless specifically noted otherwise.

DETAILED DESCRIPTION OF ILLUSTRATIVE EMBODIMENTS

Direct connections or couplings shown in the drawings or described herein, i.e., connections or couplings without intervening elements, may be replaced by indirect connections or couplings, i.e., connections or couplings comprising one or more intervening elements, and vice versa, as long as the general function of the respective connection or coupling, for example, to transmit a certain kind of information, is maintained. While in some embodiments connections or couplings shown in the drawings or described herein may be implemented as wire-based connections or couplings, for example, using conductive paths within an integrated circuit, in other embodiments some or all of such connections or couplings may also be implemented using wireless connections or couplings.

Some of the embodiments described in the following relate to oscillator devices where an oscillator circuit is controlled based on a comparison between a reference resistor value and a frequency variable resistor value, the frequency variable resistor value being dependent from an output of the oscillator. In some implementations, a sample and hold circuit is used to receive a signal depending on the reference resistor value and a signal depending on a value of the frequency variable resistor. An oscillator may then be controlled based on one or more signals output from the sample and hold circuit.

Figure 1:
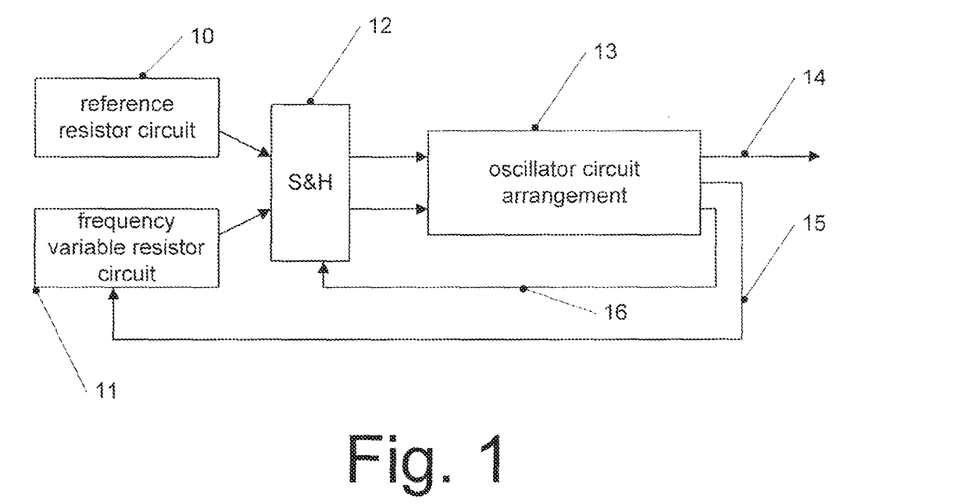
FIG. 1 is a schematic block diagram of an oscillator device according to an embodiment.

Turning now to the figures, in FIG. 1 a schematic block diagram illustrating an oscillator device according to an embodiment is shown. The various blocks depicted may in some embodiments be implemented as a single integrated circuit or part thereof.

The embodiment of FIG. 1 comprises a reference resistor circuit 10 and a frequency variable resistor circuit 11. Reference resistor circuit 10 may comprise a reference resistor having a fixed value. Reference resistor circuit 10 is configured to output a first signal, for example, a voltage signal or a current signal, indicative of a resistance value (e.g., ohmic resistance, impedance . . . ) of the reference resistor. Frequency variable resistor circuit 11 comprises a resistor having a resistance value which depends on a frequency of a signal supplied to the frequency variable resistor circuit 11. In the embodiment of FIG. 1, as will be explained later in some more detail, such a signal is supplied to frequency variable resistor circuit 11 by an oscillator circuit arrangement 13, as indicated by an arrow 15.

Frequency variable resistor circuit 11 outputs a second signal which is indicative of a resistance value (e.g., ohmic resistance, impedance . . . ) of the frequency variable resistor of frequency variable resistor circuit 11.

The first signal from reference resistor circuit 10 and the second signal from frequency variable resistor circuit 11 are provided to a sample and hold circuit 12 which samples the first signal and the second signal at sampling times, for example, sampling times corresponding to regular intervals, and outputs the respective sampled values until the next sampling time. Generally, a sample and hold circuit samples a signal at a specific point in time and outputs the sampled values with essentially constant value until the next sampling point, i.e., the sampled value is "held."

A sampling timing, i.e., the sample times mentioned above, in the embodiment of FIG. 1 is controlled by a signal output from oscillator circuit arrangement 13 as indicated by an arrow 16.

The sampled first signal and the sampled second signal are fed to oscillator circuit arrangement 13. Oscillator circuit arrangement 13 in an embodiment comprises a controllable oscillator. A controllable oscillator in the context of the present application may refer to an oscillator the frequency of which is controllable by a control signal. A signal generated by the oscillator of oscillator circuit arrangement 13 may be output as indicated by an arrow 14 and, for example, used in communication circuitry or digital logic circuitry.

In some embodiments, a controllable oscillator of oscillator circuit arrangement 13 may be controlled based on the sampled first signal and the sampled second signal. For example, the controllable oscillator may be controlled based on a difference or comparison between the sampled first signal and the sampled second signal.

In some embodiments, oscillator circuit arrangement 13 may, for example, comprise a frequency divider circuit to generate the signals fed to frequency variable resistor circuit 11 as indicated by arrow 15 and/or to sample and hold circuit 12 as indicated by arrow 16 based on an output of the above-mentioned oscillator. For example, these frequency divided signals may be a divided version of the signal output as indicated by an arrow 14. Frequency division factors for the signals output according to arrow 15 and output according to arrow 16 may differ from each other in some embodiments. In other embodiments, the signal output according to arrow 15 and the signal output according to arrow 16 may have a phase offset.

In some embodiments, by the device of FIG. 1, a control loop is implemented which regulates the output frequency of oscillator circuit arrangement 13 such that a resistance value of a frequency variable resistor of frequency variable resistor circuit 11 matches a resistance value of a reference resistor of reference resistor circuit 10. In this way, in some embodiments, a predetermined output frequency may be obtained with high accuracy.

Details of possible implementations of the various elements and blocks discussed with reference to FIG. 1 will be given later with reference to FIGS. 3-9.

Figure 2:
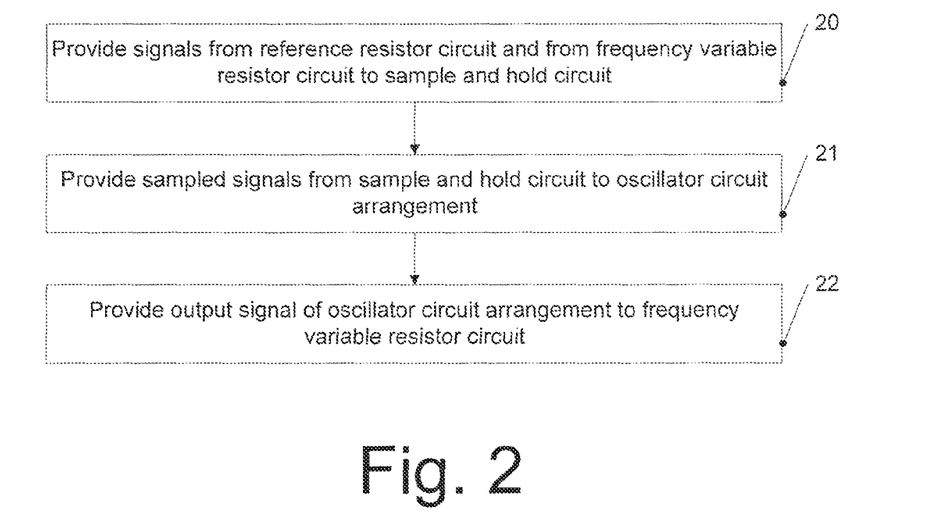
FIG. 2 is a flowchart illustrating a method according to an embodiment.

In FIG. 2, a flowchart illustrating a method according to an embodiment is shown. While the method is depicted in FIG. 2 as a series of acts of events, the order these acts or events are illustrated is not to be construed as limiting. For example, the acts or events disclosed with reference to FIG. 2 may be performed continuously in a control loop as, for example, shown in FIG. 1 or as will be explained later with reference to FIG. 3 or FIG. 6. However, application of the method of FIG. 2 is not limited to the devices shown in the figures or described herein.

At 20, signals (e.g., a first signal and a second signal) are provided from a reference resistor circuit and from a frequency variable resistor circuit to a sample and hold circuit, for example, sample and hold circuit 12 of FIG. 1. The signals may be indicative of a resistance value of a reference resistor of the reference resistor circuit and of a resistance value of a frequency variable resistor of the frequency variable resistor circuit.

At 21, the sampled signals are provided from the sample and hold circuit 12 to an oscillator circuit arrangement. In some embodiments, a frequency of an oscillator of the oscillator circuit arrangement may be controlled based on the sampled signals. At 22, an output signal of the oscillator circuit arrangement is provided to the frequency variable resistor circuit such that, e.g., a resistance value of the frequency variable resistors of the frequency variable resistor circuit depends on the output signal of an oscillator of the oscillator circuit arrangement.

By performing the acts with respect to 20, 21 and 22 continuously, a control loop may be established which regulates a frequency of the oscillator circuit arrangement such that a resistance value of the frequency variable resistor becomes equal to a resistance value of the reference resistor. In other embodiments, other approaches and techniques may be employed.

Figure 3:
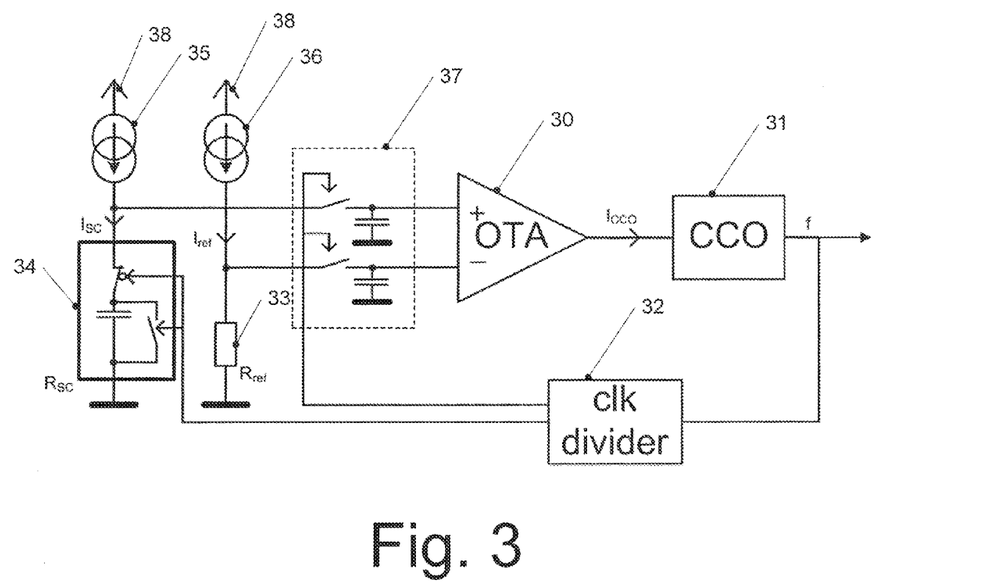
FIG. 3 is a diagram illustrating an oscillator device according to an embodiment.

In FIG. 3, a further embodiment of an oscillator device according to an embodiment is shown. The embodiment of FIG. 3 comprises a frequency variable resistor circuit which comprises a frequency variable resistor 34 and a current source 35 coupled between a positive supply voltage indicated by an arrow 38 and ground. Possible implementations of frequency variable resistor 34, which is also labeled $R_{SC}$ in FIG. 3, will be explained later with reference to FIGS. 4 and 5. A current flowing through frequency variable resistor 34 is labeled $I_{SC}$ in FIG. 3.

Furthermore, the embodiment of FIG. 3 comprises a reference resistor circuit comprising a current source 36 and a reference resistor 33, also labeled $R_{ref}$, which are coupled between a first supply voltage, e.g., positive supply voltage 38, and a second supply voltage, e.g., ground as shown. A current flowing via reference resistor 33 is labeled $I_{ref}$ in FIG. 3.

Current $I_{SC}$ depends on a resistance value of frequency variable resistor 34, which in turn depends on a frequency of one or more control signals supplied to frequency variable resistor 34, as will be explained later in more detail.

A first signal, e.g., a voltage signal, is tapped at a node between current source 35 and frequency variable resistor 34 and supplied to a first input of a sample and hold circuit 37. A second signal, e.g., a voltage signal, is tapped at a node between current source 36 and reference resistor 33 and supplied to a second input of sample and hold circuit 37. In FIG. 3, sample and hold circuit 37 is depicted as a simple first order sample and hold circuit using one switch and one capacitor for each of the first signal and the second signal, although other types of sample and hold circuits, for example, higher order sample and hold circuits, may be used in other embodiments.

A sampling of sample and hold circuit 37 (in the embodiment of FIG. 3 comprising to a closing of the switches detected) is controlled by a signal received from a clock divider 32.

Generally, when the switches of sample and hold circuit 37 are closed, the capacitors of sample and hold circuit 37 are charged. When the switches are then opened, the capacitors serve to keep a signal level ("hold") on the respective connection.

The sampled first signal (i.e., signal depending on $I_{SC}$) is fed to a positive input of an operational transconductance amplifier 30, and the sampled second signal (depending on $I_{ref}$) is provided to a negative input of operational transconductance amplifier 30. Depending on the sampled first signal and the sampled second signal, operational transconductance amplifier 30 outputs a current $I_{CCO}$ which controls a current controlled oscillator 31. In particular, a frequency f of an output signal of current controlled oscillator 31 depends on current $I_{CCO}$.

The output signal of current controlled oscillator 31 may be used for any desired purpose, for example, as clock signal for a logic circuit or a communication circuit or also as carrier wave for communication purposes. Furthermore, the output signal of current controlled oscillator 31 is provided to clock divider 32. Clock divider 32 receives the output signal having the frequency f and outputs for example two frequency divided signals, i.e., signals with a frequency f/n, n being a frequency division factor greater than 1. Depending on the application, n may be an integer number or a non-integer number. A first frequency divided signal as shown in FIG. 3 is used to control switches of frequency variable resistor 34. A second frequency divided signal is used to control sample and hold circuit 37, for example, control the closing and opening of switches thereof.

In an embodiment, a frequency division factor of the first frequency divided signal may be different from, for example, higher than, a frequency division factor of the second frequency divided signal. In other embodiments, the frequency division factors may be equal. In some embodiments, the phase of the first frequency divided signal may be equal to a phase of the second frequency divided signal. In other embodiments, the phases may differ, for example, to obtain a desired timing of the switches of sample and hold circuit 37 with respect to a timing of switches of frequency variable resistor 34.

With the described circuit of FIG. 3, the frequency f of the output signal of current controlled oscillator (CCO) 31 may be regulated such that the first signal supplied to sample and hold circuit 37 becomes equal to the second signal supplied to sample and hold circuit 37, which, provided that current sources 35, 36 are essentially equal, provides that a voltage drop over frequency variable resistor 34 is equal to a voltage drop over reference resistor 33. Therefore, by selecting a resistance value of reference resistor 33 with a desired accuracy, the frequency f may be regulated to a desired value with a desired accuracy in some embodiments.

In some embodiments, by using sample and hold circuit 37 in an essentially steady state (i.e., when the frequency f has reached a desired value) essentially constant signals are supplied to operational transconductance amplifier (OTA) 30. Therefore, in some embodiments no high-speed operation is required from operational transconductance amplifier 30, which may make it possible to implement operational transconductance amplifier 30 with lower current consumption than in conventional approaches. Furthermore, as at least during the "hold" phases of sample and hold circuit 37 the first and second sample signals are essentially constant, an influence of parasitic capacitances at inputs of operational transconductance amplifier 30 may, in many cases, be negligible. The constant signals fed to operational transconductance amplifier 30 lead to a likewise essentially constant output signal $I_{CCO}$ which enables a direct control of current controlled oscillator 31 without the need of a loop filter in some embodiments, which saves chip area. However, in other embodiments a loop filter may be used.

In some embodiments, a sampling timing of sample and hold circuit 37 may be selected such that the first signal is at or near a maximum value. For example, a sampling timing of sample and hold circuit 37 may be selected such that sampling occurs at or near an end of a switching cycle (i.e., a cycle operating the switches) of frequency variable resistor 34. Through such sampling timing, the first signal may be sampled at or near a peak thereof, which in some embodiments may lead to comparatively high input signals for operational transconductance amplifier 30, for example, at or near a peak voltage. This in some embodiments may increase accuracy of the device of FIG. 3, as an error of operational transconductance amplifier 30 in a steady state may be reduced in some embodiments.

Figure 4:
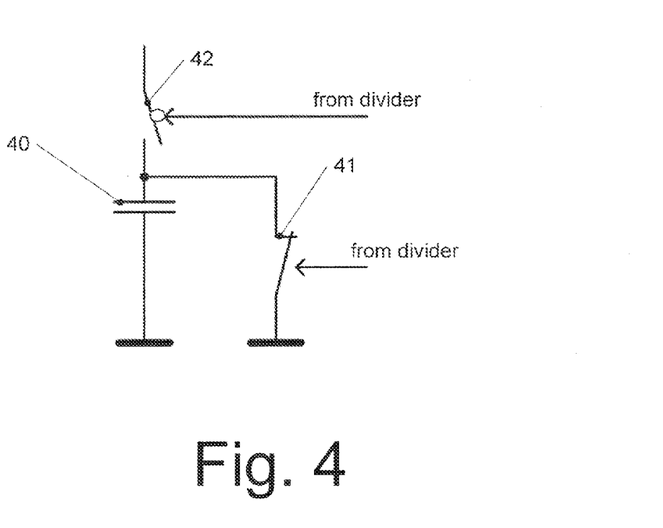
FIG. 4 is a circuit diagram illustrating a frequency variable resistor usable in some embodiments.

Next, possible implementations of frequency variable resistor 34 according to embodiments will be explained in more detail. In FIG. 4, a first implementation example for a frequency variable resistor is shown. The implementation of FIG. 4 corresponds to the implementation schematically represented in FIG. 3 and comprises a capacitance 40, a first switch 41 and a second switch 42. First switch 41 and second switch 42 are controlled by a signal derived from an output signal of an oscillator used, in the example of FIG. 3 by the first divided signal output by clock divider 32. In the embodiment of FIG. 4, the control is such that when switch 41 is closed, switch 42 is opened and vice versa, as symbolized by a circle at switch 42. Depending on the frequency of the signal from divider 32 or any other control signal, the switching speed of switches 41, 42 varies, which is turn varies the effective resistance of the frequency variable resistor.

Figure 5:
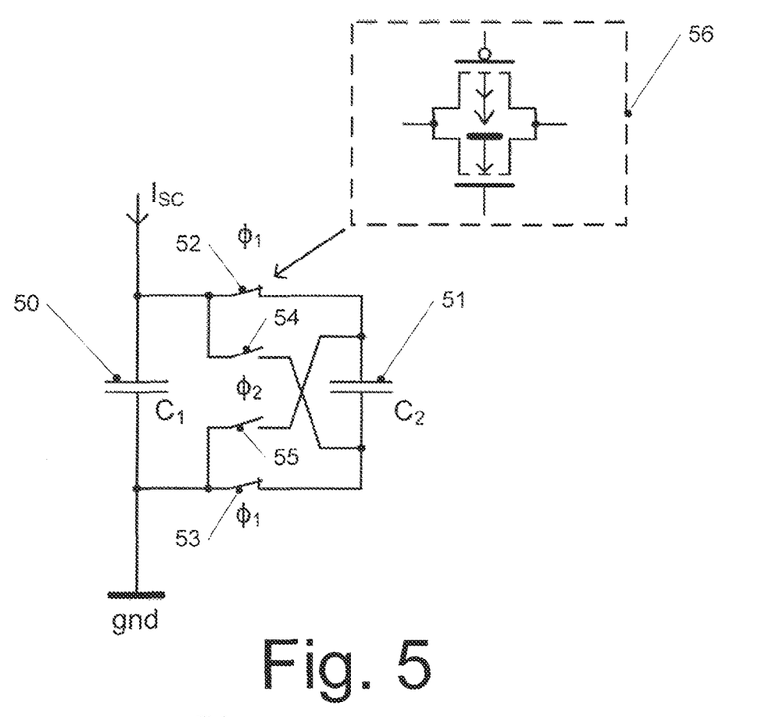
FIG. 5 is a circuit diagram illustrating a frequency variable resistor usable in some embodiments.

A further embodiment of a frequency variable resistor is shown in FIG. 5. The frequency variable resistor of FIG. 5 may be employed for example as frequency variable resistor 34 in FIG. 3 or in frequency variable resistor circuit 11 of FIG. 1, but may also be used as frequency variable resistor for other purposes. In the embodiment of FIG. 5, the frequency variable resistor comprises a first capacitance 50, also labeled $C_1$, and a second, switched, capacitance 51, also labeled $C_2$. Switches 52, 53, 54 and 55 are coupled between first capacitance 50 and second capacitance 51 as shown in FIG. 5. As indicated by $\phi_1$, switches 52 and 53 are controlled during a first phase of a control signal (for example, the signal output by clock divider 32 of FIG. 3 or the signal indicated by arrow 15 of FIG. 1), and switches 54, 55 as indicated by $\phi_2$ are controlled by a second phase. For example, switches 52, 53 may be closed when the control signal is high and opened when the control signal is low, while switches 54, 55 may be closed when the respective control signal is low and opened when the control signal is high. In other words, similar to what was explained for the embodiment of FIG. 4, when switches 52, 53 are closed, switches 54, 55 are open and vice versa.

To use both phases $\phi_1$ and $\phi_2$, second capacitance 51 is "rotated." While one side, for example, one electrode, of second capacitance 51 is charged, the other side, for example, the other electrode, is discharged and vice versa by the arrangement of FIG. 5. For example, when switches 52, 53 are closed and switches 54, 55 are opened, a first terminal of capacitance 50 is coupled with a first terminal of capacitance 51, and a second terminal of capacitance 50 is coupled with a second terminal of capacitance 51. When switches 52, 53 are open and switches 54, 55 are closed, the first terminal of capacitance 50 is coupled with the second terminal of capacitance 51, and the second terminal of capacitance 50 is coupled with the first terminal of capacitance 51.

In a box 56, a possible implementation of switches 52-55 as T-gates is shown.

In the implementation of a frequency variable resistor shown in FIG. 5, a capacitance value may be constant in each phase of a full period of a control signal controlling switches 52-55. Furthermore, while in other embodiments two separate capacitances may be used for the two phases $\phi_1$ and $\phi_2$, one for charging and one for discharging, using a single capacitance, like capacitance 51 in the manner of FIG. 5, in some embodiments avoids problems with matching between two capacitances.

The frequency variable resistors shown in FIGS. 4 and 5 serve only as examples, and other implementations are also possible.

Figure 6:
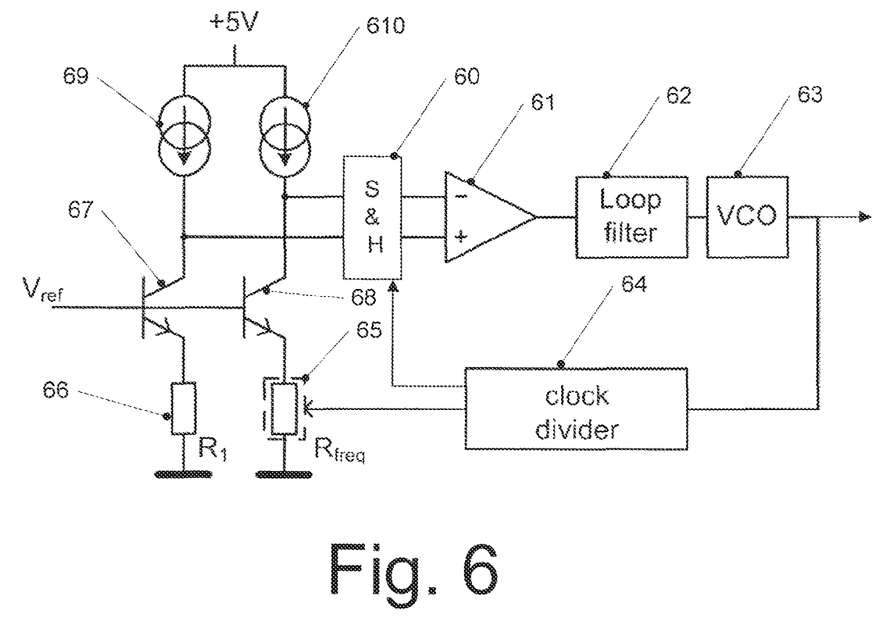
FIG. 6 is a diagram illustrating an oscillator device according to a further embodiment.

In FIG. 6, a further embodiment of an oscillator device according to an embodiment is shown. In the embodiment of FIG. 6, a variable frequency resistor circuit comprises a current source 610, a transistor 68, the gate of which is biased by a reference voltage $V_{ref}$, and a frequency variable resistor $R_{freq}$ which are coupled in series between a positive supply voltage, for example +5 V or any other positive voltage, and ground. Furthermore, a frequency variable resistor circuit comprises a current source 69, a transistor 67, the gate of which is also biased by reference voltage $V_{ref}$, and a reference resistor 66, also labeled $R_1$.

A first signal is tapped at a node between current source 69 and transistor 67, and a second signal is tapped at a node between current source 610 and transistor 68. The first signal and the second signal are fed to a sample and hold circuit 60, which may be implemented as already described with reference to FIG. 3. In response to the first and second signals, sample and hold circuit 60 generates a sampled first signal and a sampled second signal. The sampled first signal is fed to a positive input of a difference amplifier 61, and the sampled second signal is fed to a negative input of difference amplifier 61. A loop filter 62 filters an output of difference amplifier 61. In other embodiments, loop filter 62 may be omitted. An output signal of loop filter 62 controls a voltage controlled oscillator 63. An output signal of voltage controlled oscillator 63 may, for example, be used as a clock signal or carrier signal as already explained previously, and is additionally fed to a clock divider 64. Output signals of clock divider 64 control sample and hold circuit 60 and also control frequency variable resistor 65, similar to what has been explained for the embodiment of FIG. 3.

Frequency variable resistor 65 may be implemented for example as explained with reference to FIGS. 4 and 5.

Therefore, a sample and hold circuit may not only be used together with the reference resistor circuit and frequency variable resistor circuit as shown in FIG. 3, but also together with the circuits shown in FIG. 6 or any other kind of circuits as generically shown in FIG. 1, and application of the techniques disclosed herein is not restricted to a current controlled oscillator as shown in FIG. 3, but other oscillator types like a voltage controlled oscillator as depicted in FIG. 6 or other kinds of controllable oscillators may also be used.

Figure 7:
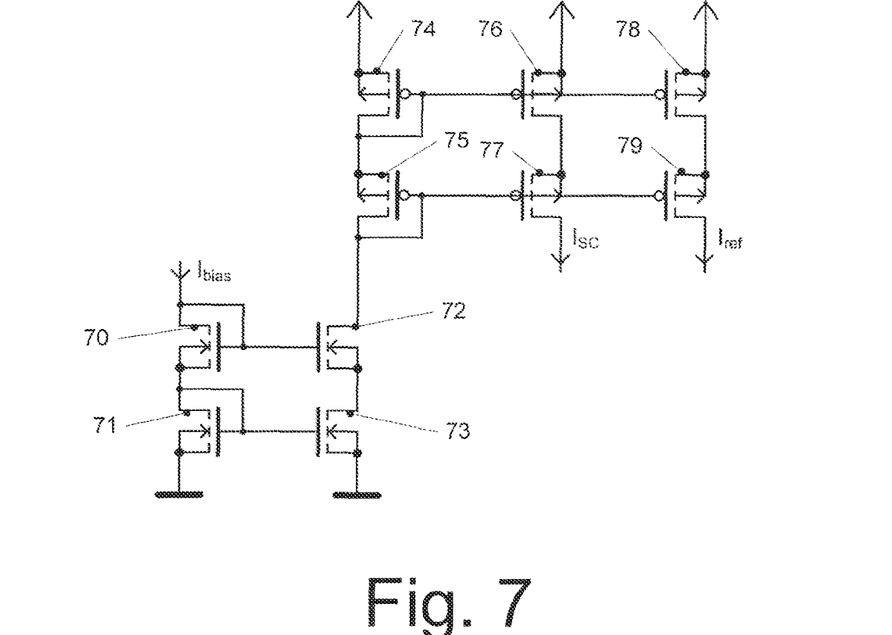
FIG. 7 illustrates an example implementation of current sources according to an embodiment.
Figure 8:
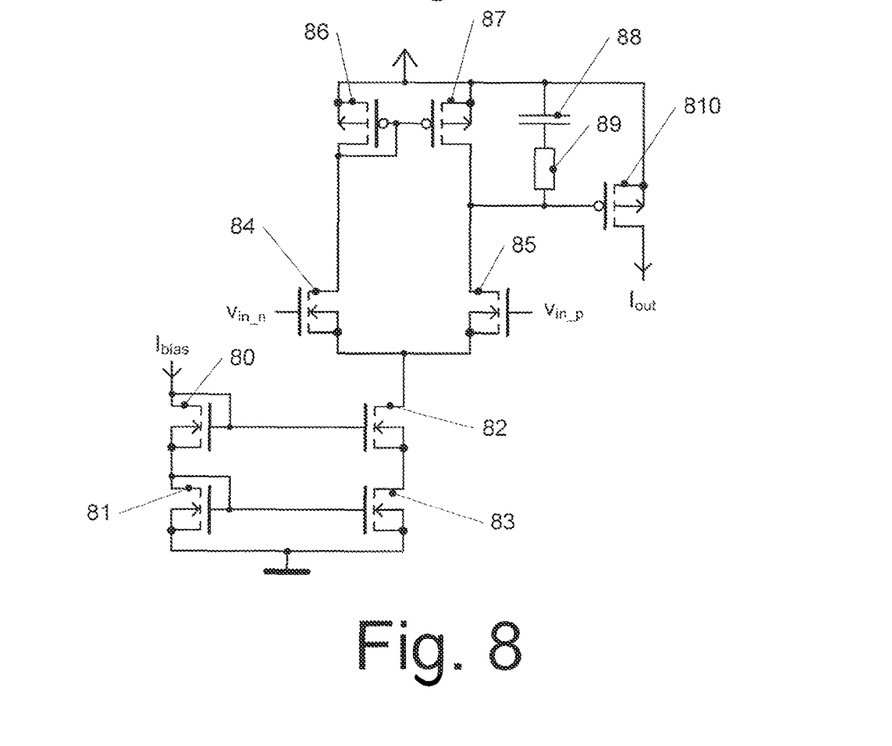
FIG. 8 illustrates an example implementation of a transconductance amplifier according to an embodiment.
Figure 9:
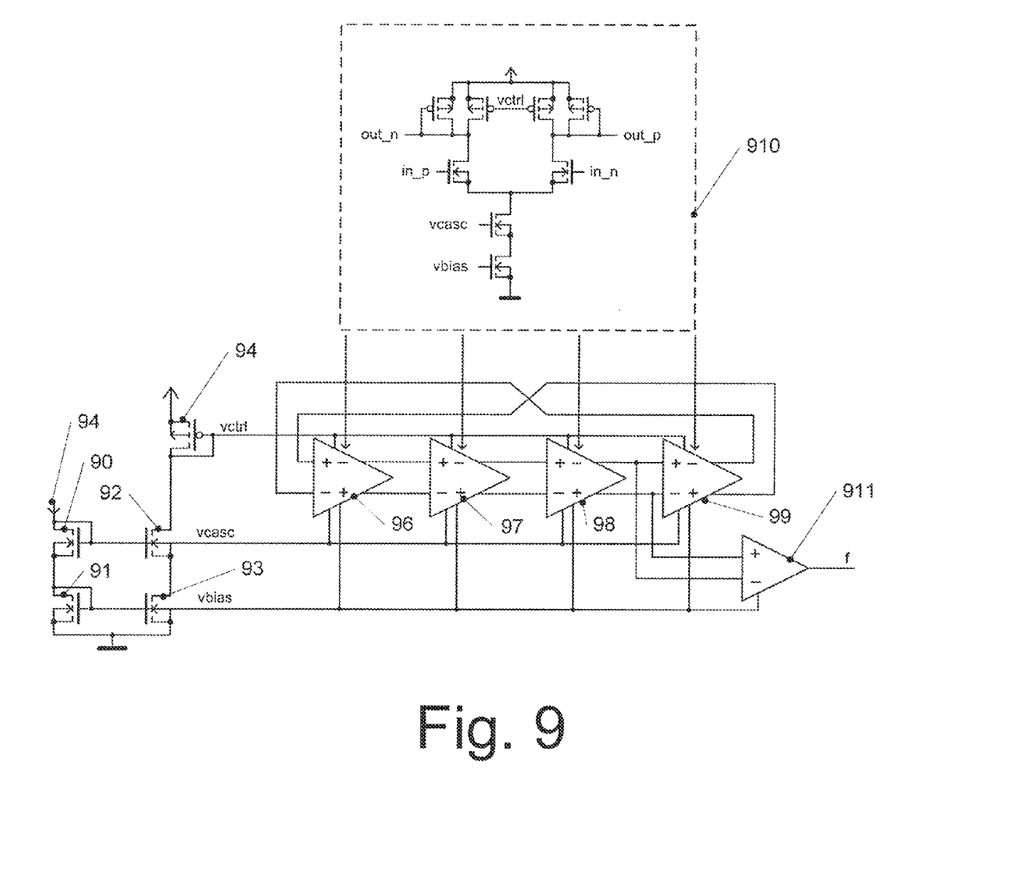
FIG. 9 illustrates an example implementation of a current controlled oscillator according to an embodiment.

Next, to further the understanding of some embodiments, implementation examples of some components of the embodiment of FIG. 3 will be discussed in more detail. These implementation examples serve only as examples, and other implementations of the shown components may also be used. In FIGS. 7-9, similar to FIG. 3 (element 38) a positive supply voltage is represented by an arrow.

FIG. 7 shows an example implementation of current sources for a reference resistor circuit and frequency variable resistor circuit, for example, for current sources 35 and 36 of FIG. 3. Other implementations may also be used. The implementation example of FIG. 7 comprises NMOS transistors 70-73 and PMOS transistors 74-79 which form current mirrors as depicted in FIG. 7. With the arrangement of FIG. 7, the currents $I_{SC}$ and $I_{ref}$ are derived from a bias current $I_{bias}$. By using the same source for generating $I_{SC}$ and $I_{ref}$ (i.e., $I_{bias}$), temperature variations influence both currents $I_{SC}$ and $I_{ref}$, which reduces an overall influence of temperature variations on the oscillator device in some embodiments. In some embodiments, deviations in a matching of the PMOS current mirrors used, for example, deviations between transistors 76 and 78 or between transistors 77 and 79, may have a negative influence, which may be avoided by corresponding dimensioning of the transistors.

In FIG. 8, an implementation example of an operational transconductance amplifier usable in embodiments, for example, as operational transconductance amplifier 30 in FIG. 3, is shown. Other implementations may also be used.

The circuit of FIG. 8 receives a bias current $I_{bias}$ which may be the same bias current as used for generating the currents $I_{SC}$, $I_{ref}$ in FIG. 7, at a different bias current. NMOS current mirrors comprising NMOS transistors 80-83 mirror this current to an input stage comprising NMOS transistors 84, 85. For example, NMOS transistors 84, 85 may receive the first and second sampled signals from sample and hold circuit 37 of FIG. 3 as input voltages $V_{in\_n}$ and $V_{in\_p}$, respectively. Furthermore, the implementation of FIG. 8 comprises PMOS transistors 86, 87 and 810 as well as a capacitance 88 and a resistor 89 as shown in FIG. 8 and outputs an output current $I_{out}$ which, for example, may correspond to current $I_{CCO}$ in FIG. 3.

In FIG. 9, an implementation example of a current controlled oscillator like current controlled oscillator 31 of FIG. 3 is illustrated. In the implementation example of FIG. 9, the oscillator is implemented as a four level ring oscillator represented by amplifiers 96-99 with adaptive biasing and symmetric load and a comparator 911 for generating a rail-to-rail output signal. In the implementation of FIG. 9, the oscillator receives a control current like current $I_{CCO}$ of FIG. 3. This current is mirrored by PMOS transistors 90-93 to generate voltages vcasc, vbias. Furthermore, at a PMOS transistor 94 a voltage vctrl is generated. Voltages vctrl, vcasc and vbias are fed to amplifiers 96-99 as shown. A box 910 shows a possible implementation of amplifiers 96-99. Other types of oscillators also may be used.

It should be noted that ring oscillators with less stages or more stages as well as other conventional types of oscillators may also be used. Generally, the detailed implementation examples of FIGS. 7-9 merely serve to further the understanding of the present application and are not to be construed as limiting.

As already emphasized, the above-discussed embodiments serve only as examples, and various modifications and variations, some of which already have been described above, are possible without departing from the scope of the application.

What is claimed is:

1. An apparatus comprising:
   an oscillator circuit arrangement;
   a frequency variable resistor circuit coupled to an output of the oscillator circuit arrangement;
   a reference resistor circuit; and
   a sample and hold circuit, a first input of the sample and hold circuit being coupled to an output of the reference resistor circuit and a second input of the sample and hold circuit being coupled to an output of the frequency variable resistor circuit,
   wherein an output of the sample and hold circuit is coupled with an input of the oscillator circuit arrangement, and
   wherein the sample and hold circuit is configured to sample signals received at the first and second inputs at specific sampling points in time and to output sampled values with essentially constant values until a respective next sampling point.

2. The apparatus of claim 1, wherein the oscillator circuit arrangement comprises a controllable oscillator, wherein the oscillator circuit arrangement is configured to control a frequency of the controllable oscillator based on the output of the sample and hold circuit.

3. The apparatus of claim 2, wherein the output of the sample and hold circuit comprises a first output to output a first sampled signal based on a first signal received from the frequency variable resistor circuit and a second output to output a second sampled signal based on a second signal output from the reference resistor circuit, wherein the oscillator circuit arrangement is configured to control the controllable oscillator based on a difference between the first sampled signal and the second sampled signal.

4. The apparatus of claim 2, wherein the output of the sample and hold circuit comprises a first output and a second output, wherein the oscillator circuit arrangement comprises an operational transconductance amplifier, a first input of the operational transconductance amplifier being coupled with the first output of the sample and hold circuit and a second input of the operational transconductance amplifier being coupled with the second output of the sample and hold circuit, and an output of the operational transconductance amplifier being coupled with an input of the controllable oscillator.

5. The apparatus of claim 4, wherein the controllable oscillator comprises a current controlled oscillator.

6. The apparatus of claim 1, wherein the output of the oscillator circuit arrangement is coupled with a clock input of the sample and hold circuit.

7. The apparatus of claim 1, wherein the oscillator circuit arrangement comprises a clock divider, wherein an output of the clock divider is coupled with an input of the frequency variable resistor circuit.

8. The apparatus of claim 1, wherein the frequency variable resistor circuit comprises a current source and a frequency variable resistor coupled in series between a first supply voltage and a second supply voltage, wherein the output of the frequency variable resistor circuit is tapped at a node between the current source and the frequency variable resistor.

9. The apparatus of claim 1, wherein a frequency variable resistor of the frequency variable resistor circuit comprises a switch, the switch being controlled by an output signal of the oscillator circuit arrangement.

10. The apparatus of claim 1, wherein a frequency variable resistor of the frequency variable resistor circuit comprises:
a first capacitance;
a second capacitance;
a pair of first switches; and
a pair of second switches,
wherein, when the pair of first switches is closed and the pair of second switches is opened, a first terminal of the first capacitance is coupled with a first terminal of the second capacitance and a second terminal of the first capacitance is coupled with a second terminal of the second capacitance, and wherein, when the first pair of switches is opened and when the second pair of switches is closed, the first terminal of the first capacitance is coupled with the second terminal of the second capacitance and the second terminal of the first capacitance is coupled with the first terminal of the second capacitance.

11. An apparatus comprising:
a reference resistor circuit;
a frequency variable resistor circuit; and
an oscillator circuit arrangement comprising a controllable oscillator and being configured to control a frequency of the controllable oscillator based on an output of the reference resistor circuit and the frequency variable resistor circuit, wherein the frequency variable resistor circuit is coupled to an output of the oscillator circuit arrangement, wherein the frequency variable resistor circuit comprises a first capacitance, a second capacitance, a first pair of switches and a second pair of switches, the first pair of switches and the second pair of switches being controlled by different phases of a first output signal of the oscillator circuit arrangement, wherein, when the first pair of switches is closed and the second pair of switches is open, a first terminal of the first capacitance is coupled with a first terminal of the second capacitance and a second terminal of the first capacitance is coupled with a second terminal of the second capacitance, and wherein, when the first pair of switches is open and the second pair of switches is closed, the first terminal of the first capacitance is coupled with the second terminal of the second capacitance and the second terminal of the first capacitance is coupled with the first terminal of the second capacitance.

12. The apparatus of claim 11, wherein a switch of the first pair of switches or the second pair of switches comprises a T-gate switch.

13. The apparatus of claim 11, further comprising a sample and hold circuit coupled between the reference resistor circuit and the oscillator circuit arrangement and between the frequency variable resistor circuit and the oscillator circuit arrangement.

14. The apparatus of claim 13, wherein the sample and hold circuit is controlled by a second output signal of the oscillator circuit arrangement such that sampling occurs at an end of a control period of the frequency variable resistor circuit.

15. A method comprising:
providing a first signal from a reference resistor circuit and a second signal from a frequency variable resistor circuit to a sample and hold circuit;
providing a sampled first signal and a sampled second signal from the sample and hold circuit to an oscillator circuit arrangement; and
providing an output signal of the oscillator circuit arrangement to the frequency variable resistor circuit, wherein providing the sampled first signal and the sampled second signal to the oscillator circuit arrangement comprises providing the sampled first signal from the first signal and the sampled second signal form the second signal at specific sampling points in time with essentially constant values until a respective next sampling point.

16. The method of claim 15, further comprising controlling a sampling of the sample and hold circuit to be at an end of a period of the output signal provided to the frequency variable resistor circuit.

17. The method of claim 15, further comprising controlling a controllable oscillator of the oscillator circuit arrangement based on a difference between the first sampled signal and the second sampled signal.

18. The method of claim 17, wherein the oscillator circuit arrangement is a current controlled oscillator, and the controlling comprises generating a control current based on a difference between the first sampled signal and the second sampled signal.

19. The method of claim 15, further comprising charging a first side of a capacitor of the frequency variable resistor circuit and discharging a second side of the capacitor during a first phase of the output signal of the oscillator circuit arrangement, and discharging the first side of the capacitor and charging the second side of the capacitor during a second phase of the output signal of the oscillator circuit arrangement.

20. The method of claim 15, further comprising dividing a clock signal of an oscillator of the oscillator circuit arrangement to generate the output signal of the oscillator circuit arrangement provided to the frequency variable resistor circuit.

\* \* \* \* \*